(12) United States Patent
Schauer et al.

(10) Patent No.: US 12,133,331 B2
(45) Date of Patent: Oct. 29, 2024

(54) CIRCUIT BOARD ASSEMBLY

(71) Applicant: WAGO Verwaltungsgesellschaft mbH, Minden (DE)

(72) Inventors: Gerald Schauer, Nuetringen (DE); Eugen Meister, Leinfelden (DE)

(73) Assignee: Wago Verwaltungsgesellschaft MBH, Minden (DE)

( * ) Notice: Subject to any disclaimer, the term of this patent is extended or adjusted under 35 U.S.C. 154(b) by 0 days.

(21) Appl. No.: 18/099,141

(22) Filed: Jan. 19, 2023

(65) Prior Publication Data

US 2023/0232534 A1 Jul. 20, 2023

(30) Foreign Application Priority Data

Jan. 19, 2022 (DE) ...................... 20 2022 100 279.7

(51) Int. Cl.
*H05K 1/14* (2006.01)
*H05K 3/36* (2006.01)

(52) U.S. Cl.
CPC ............. *H05K 1/148* (2013.01); *H05K 3/366* (2013.01); *H05K 2201/047* (2013.01)

(58) Field of Classification Search
CPC ... H05K 1/148; H05K 2201/047; H05K 3/366
See application file for complete search history.

(56) References Cited

U.S. PATENT DOCUMENTS

| | | | |
|---|---|---|---|
| 3,971,127 A | 7/1976 | Giguere et al. | |
| 4,801,992 A * | 1/1989 | Golubic | H01L 23/5385 361/728 |
| 4,833,568 A * | 5/1989 | Berhold | H05K 7/023 361/749 |
| 4,990,948 A * | 2/1991 | Sasaki | G03B 17/02 361/749 |
| 6,137,691 A | 10/2000 | Jang | |
| 6,501,653 B1 * | 12/2002 | Landsgestell | H02M 7/003 174/15.1 |
| 6,580,608 B1 * | 6/2003 | Searls | H01L 23/3675 257/713 |
| 10,342,152 B2 | 6/2019 | Harrer et al. | |
| 2014/0160692 A1* | 6/2014 | Lau | H05K 3/366 361/736 |
| 2021/0195747 A1* | 6/2021 | Seow | H05K 1/028 |

FOREIGN PATENT DOCUMENTS

| | | | |
|---|---|---|---|
| CN | 102313548 A * | 1/2012 | ........... H05K 3/4691 |
| DE | 102007046493 A1 | 4/2009 | |
| DE | 102013216493 A1 * | 2/2015 | ........... H05K 3/4691 |
| DE | 102015216419 A1 | 3/2017 | |
| DE | 102020106404 A1 | 9/2021 | |

* cited by examiner

*Primary Examiner* — Paresh Paghadal
(74) *Attorney, Agent, or Firm* — Muncy, Geissler, Olds & Lowe, P.C.

(57) ABSTRACT

A system for the assembly of circuit boards is shown. The system includes an assembly device and a circuit board. The assembly device comprises a substantially planar base plate and guide members. The circuit board includes multiple rigid portions connected by flexible members. The guide members extend into a space partially or completely enclosed in the horizontal direction by the circuit board, and determine the position and orientation of the rigid portions relative to the base plate.

17 Claims, 18 Drawing Sheets

CIRCUIT BOARD ASSEMBLY

This nonprovisional application claims priority under 35 U.S.C. § 119(a) to German Patent Application No. 20 2022 100 279.7, which was filed in Germany on Jan. 19, 2022, and which is herein incorporated by reference.

BACKGROUND OF THE INVENTION

Field of the Invention

The present invention relates to a system for the assembly of circuit boards, an apparatus assembled by means of the assembly device and a method for the assembly of rigid-flexible circuit boards.

Description of the Background Art

Rigid-flexible circuit boards are circuit boards that combine the properties of rigid and of flexible circuit boards, for example by rigid circuit board portions being connected by means of flexible circuit board portions, whereby space-saving assemblies, for example, can be realized.

SUMMARY OF THE INVENTION

It is therefore an object of the present invention to provide a system according to the invention for the assembly of circuit board comprises an assembly device having a substantially planar base plate and guide members, which extend from the base plate in the vertical direction if the base plate is placed on a horizontal surface, and a circuit board having a first rigid portion, a second rigid portion, a third rigid portion and a fourth rigid portion, the first rigid portion being connected to the second rigid portion by means of a first flexible member, the second rigid portion being connected to the third rigid portion by means of a second flexible member, and the third rigid portion being connected to the fourth rigid portion by means of a third flexible member. The guide members may be configured to extend into a space partially or completely enclosed in the horizontal direction by the circuit board and to determine the position and orientation of the rigid portions relative to the base plate, by the guide members having surfaces against which one or several of the rigid portions and/or one or several of the flexible members abut during the assembly. For instance, the guide members may have planar surfaces against which the rigid portions abut, and have convex surfaces (e.g. rounded edges) against which the flexible members abut.

In this case, the term "circuit board", as it is used in the description and the claims, can be understood to mean, in particular, a (substantially plate-shaped) carrier structure, which is formed of an insulating material and on which electrical and/or electronic elements are disposed, which are connected to one another by means of conductive structures applied to the carrier structure or extending through the carrier structure. Furthermore, the term "rigid portion", as it is used in the description and the claims, can be understood to mean, in particular, a plate-shaped (substantially rectangular) structure, on which electrical and/or electronic components are disposed. Moreover, the term "flexible member", as it is used in the description and the claims, can be understood to mean, in particular, a flexible structure, on which no electrical and/or electronic components are disposed, with the exception of conductive structures. In this case, the flexible structure may be elastic to the extent, for example, that two rigid portions connected by the flexible structure may be orientated such that they touch without being structurally damaged (e.g. in the form of visible cracks and/or cracks that substantially affect stability). In addition, the flexible members may correspond to flexible portions of the circuit board that are formed by one or several layers formed from a flexible material, which extend through a part of the circuit board or the entire circuit board.

Moreover, the term "assembly device", as it is used in the description and the claims, can be understood to mean, in particular, a device that can be used during assembly and for the assembly of a plurality of circuit boards (and thus, with respect to a single circuit board, fulfils a shape-giving function only temporarily). Further, the term "base plate", as it is used in the description and the claims, can be understood to mean, in particular, a plate-shaped structure, which serves as a basis for other members and may be formed integrally with the guide members. In this context, a plate-shaped structure can be understood to mean, in particular, a flat structure with a substantially constant thickness and substantially rectangular contour. Further, the term "guide member", as it is used in the description and the claims, can be understood to mean, in particular, a structure which, due to its dimensioning and/or shape, permits a rigid portion to be laid against a surface of a guide portion of the guide member without the electrical and/or electronic components disposed on the rigid portion coming into contact with the guide member such that they are damaged.

For example, a guide member may (in a top view) have a substantially rectangular contour and have one or several recesses (only) in the region of a guide portion, into which the electrical and/or electronic components are introduced (without touching the guide member) if the rigid members abut against the guide members. In this case, the term "guide portion", as it is used in the description, is understood to mean, in particular, a surface region which is (completely) covered by the circuit board during assembly (e.g. the sides, which face towards the rigid portions, of a rectangular guide member which provides for a rectangular orientation of the rigid portions relative to one another). Apart from the guide members that extend into the space partially or completely enclosed in the horizontal direction by the circuit board, the system may further also have members that are arranged outside the space partially or completely enclosed in the horizontal direction by the circuit board. For example, the system may have a member which is arranged such that at the start of the assembly process, when the rigid portions are oriented parallel to each other, the circuit board is arranged between the member and the guide member, wherein the member and the guide member are offset relative to each other such that different rigid portions abut against them.

The guide members may be connected positively in the horizontal direction and frictionally in the vertical direction to the circuit board, so that the circuit board can be pulled off in an upward direction when the base plate is placed on the horizontal surface.

For example, the recesses into which the electrical and/or electronic components are introduced may be delimited only in the downward direction by a wall, so that an upward movement of the electrical and/or electronic components is not impeded.

The system may further comprise a bottom plate configured for the positive connection with the circuit board. The bottom plate may have an elongate member, which extends parallel to the base plate through an opening in one of the rigid portions and through an opening in another of the rigid portions when the bottom plate is positively connected to the circuit board, wherein the guide members are configured not to impede a vertical movement of the elongate member when the circuit board is pulled off in the upward direction.

The bottom plate may also have further elongate members, which also extend through two rigid portions or reach into two rigid portions or otherwise establish a connection with two rigid portions which stabilizes or fixes the orientation of the rigid portions relative to each other.

The assembly device may have a member issuing from the base plate and extending in the vertical direction, which, together with the base plate, frames the bottom plate, which is substantially quadrangular, on two sides when the bottom plate is fully inserted into the circuit board.

The member may also be the above-described member, which is arranged such that at the start of the assembly process, when the rigid portions are oriented parallel to each other, the circuit board is arranged between the member and the guide member.

The first rigid portion may be arranged parallel and directly adjacent to the bottom plate when the bottom plate is fully inserted into the circuit board.

The bottom plate may be adapted to the contour of the first rigid portion and protrude over the edge of the rigid portion, so that a top housing part fitting the bottom plate can be placed on the bottom plate and connected with the bottom plate, so that the top housing part and the bottom plate form a closed housing apart from one or several terminals penetrating the housing shell.

The bottom plate may be engaged with the circuit board when the bottom plate is fully inserted into the circuit board.

The fourth rigid portion may be attached to the first rigid portion by means of a detachable connection.

For example, the fourth rigid portion may be attached to the first rigid portion by means of a screw connection.

The first rigid portion and the third rigid portion may be shorter or longer than the second rigid portion and the fourth rigid portion.

The base plate may have a recess into which one of the rigid portions reaches when the rigid portion is correctly arranged on the base plate.

This may facilitate the correct positioning of the circuit board on the assembly device.

The system may further comprise a rack with which the base plate is connected rotatably about a vertical axis.

An apparatus according to the invention comprises a rigid-flexible circuit board with a first rigid portion, a second rigid portion, a third rigid portion and a fourth rigid portion, a bottom plate with a first elongate member and a second elongate member, which extend perpendicularly to the bottom plate. The first rigid portion is arranged parallel to the third rigid portion, and the second rigid portion is arranged parallel to the fourth rigid portion. The first elongate member extends through an opening in the first rigid portion and connects the third rigid portion with the first rigid portion. The second elongate member extends through an opening in the first rigid portion and connects the third rigid portion with the first rigid portion.

The first elongate member may extend through an opening in the third rigid portion. The second elongate member may also extend through an opening in the third rigid portion.

The bottom plate may further have a third elongate member and/or a fourth elongate member, which extend perpendicularly to the bottom plate.

The third elongate member may extend through an opening in the first rigid portion and connect the third rigid portion with the first rigid portion. The fourth elongate member may also extend through an opening in the first rigid portion and connect the third rigid portion with the first rigid portion.

The third elongate member may extend through an opening in the third rigid portion. The fourth elongate member may also extend through an opening in the third rigid portion.

The first rigid portion may be connected to the second rigid portion by means of a first flexible member, the second rigid portion may be connected to the third rigid portion by means of a second flexible member, and the third rigid portion may be connected to the fourth rigid portion by means of a third flexible member.

The first rigid portion may be arranged parallel and directly adjacent to the bottom plate.

A method according to the invention comprises laying a first rigid portion of a rigid-flexible circuit board against a first surface of a first guide portion of an assembly device, laying a second rigid portion of the rigid-flexible circuit board against a second surface of a second guide portion of the assembly device by bending a first flexible portion connecting the first rigid portion and the second rigid portion, and pulling off the circuit board from the assembly device along a direction which is parallel to the first rigid portion and parallel to the second rigid portion.

The method may further comprise laying a third rigid portion of the rigid-flexible circuit board against a third surface of a third guide portion of the assembly device by bending a second flexible portion connecting the second rigid portion and the third rigid portion.

The method may further comprise laying a fourth rigid portion of the rigid-flexible circuit board against a fourth surface of a fourth guide portion of the assembly device by bending a third flexible portion connecting the third rigid portion and the fourth rigid portion.

The first rigid portion may be oriented parallel to the third rigid portion, and the second rigid portion may be oriented parallel to the fourth rigid portion, when the rigid portions abut against the guide portions.

The guide portions may be connected to the circuit board frictionally in the direction, and positively transversely to the direction.

The guide portions may be formed by one or several guide members, which extend from a planar base plate in the vertical direction if the base plate is placed on a horizontal surface.

The method may further comprise attaching the fourth rigid portion and the first rigid portion to each other.

The method may further comprise inserting a bottom plate into the rigid-flexible circuit board, wherein the bottom plate has an elongate member which, after insertion, extends through an opening in one of the rigid portions and through an opening in another of the rigid portions and stabilizes a relative orientation of the rigid portions to one another.

The bottom plate may engage with the circuit board when the bottom plate is inserted to a stop into the circuit board.

The method may further comprise fitting a top housing part on the bottom plate. The top housing part fitted on the bottom plate may be engaged with the bottom plate.

Moreover, it is understood that the features described in connection with the system may also be features of the method, which relates to a possible use of the system, and vice versa.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
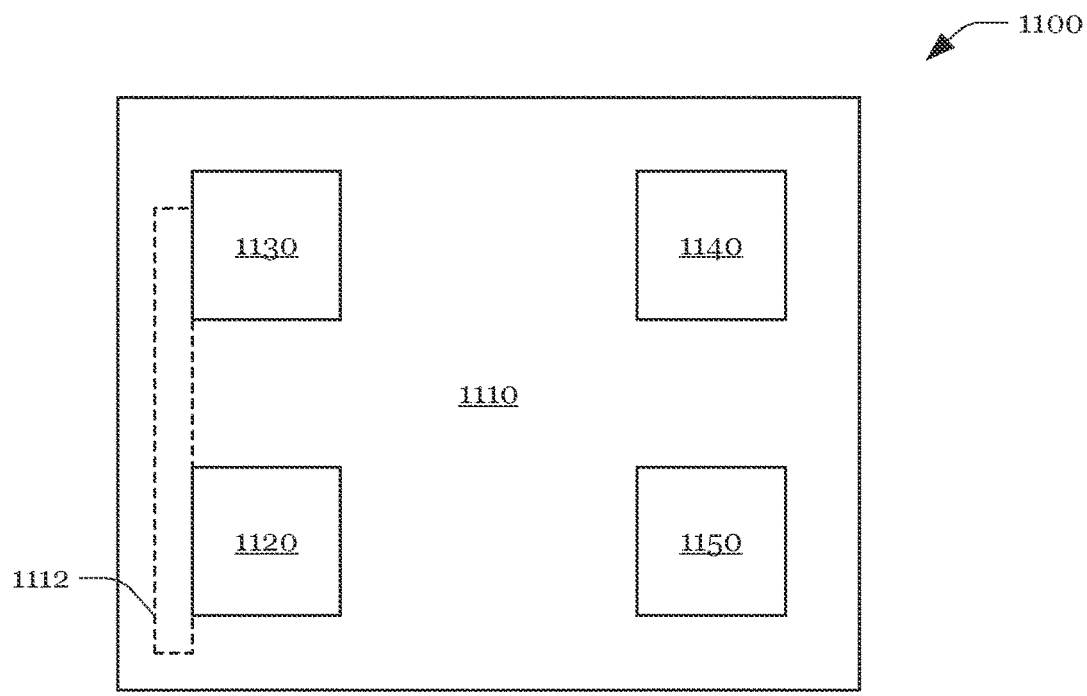
FIG. 1 shows a top view of a schematically illustrated assembly device.

FIG. 1 shows a schematic representation of an exemplary assembly device 1100 from above. The assembly device 1100 comprises a base plate 1110 and guide members 1120, 1130, 1140 and 1150, which extend upwards from the base plate 1110. The base plate 1110 and the guide members 1120, 1130, 1140 and 1150 have a rectangular contour, and the guide members 1120, 1130, 1140 and 1150 are arranged such that their centers are located in the corners of a rectangle. As is indicated in FIG. 1 by a dashed line, the base plate 1110 may comprise a recess 1112 which facilitates the correct positioning of a circuit board on the base plate 1110 by the recess 1112 being dimensioned such that a part of the circuit board reaches into the recess 1112 (only) when the circuit board (or the part of the circuit board reaching in) is correctly positioned on the base plate 1110.

Figure 2:
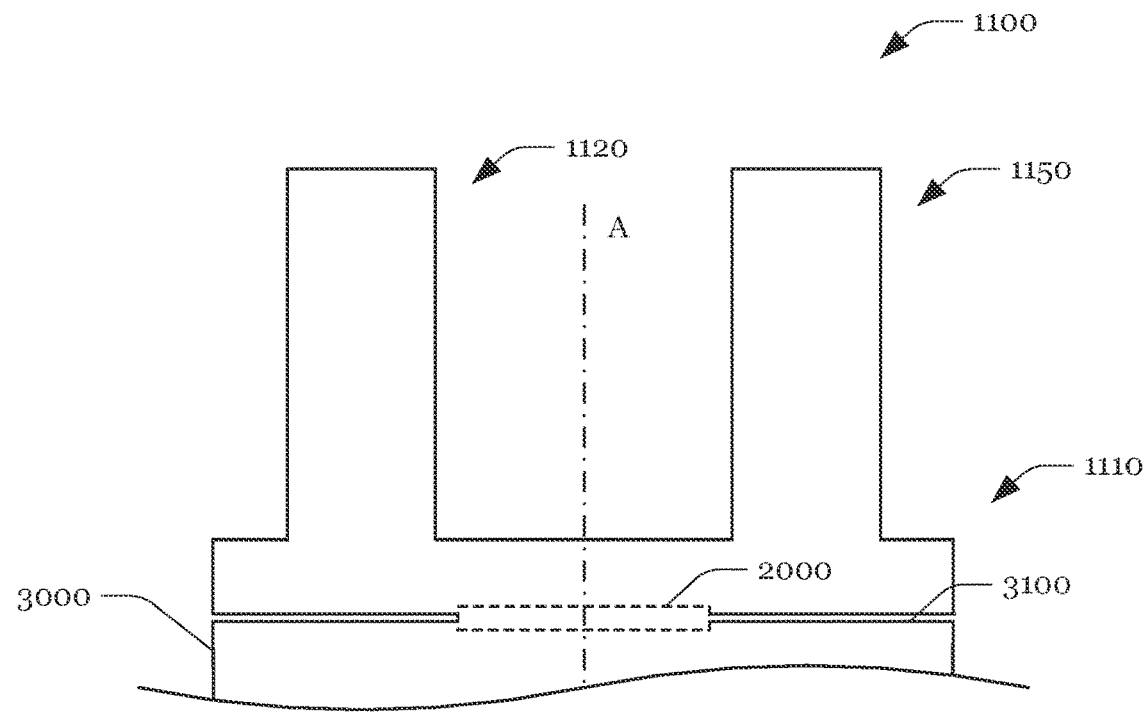
FIG. 2 shows a side view of the assembly device schematically illustrated in FIG. 1.

FIG. 2 shows a side view of the assembly device 1100 schematically illustrated in FIG. 1. In this case, the planar underside of the base plate 1110 is oriented parallel to a horizontal surface 3100, so that the guide members 1120, 1130, 1140 and 1150 extend from the base plate 1110 in the vertical direction. As is indicated in FIG. 2 by a dashed line, the assembly device 1100 may be connected to a rack 3000 by means of a rotary joint 2000, so that the base plate 1110 is rotatable about as vertical axis A. This simplifies the assembly process because the assembly device 1100 cannot slip away towards the side during assembly.

Figure 3:
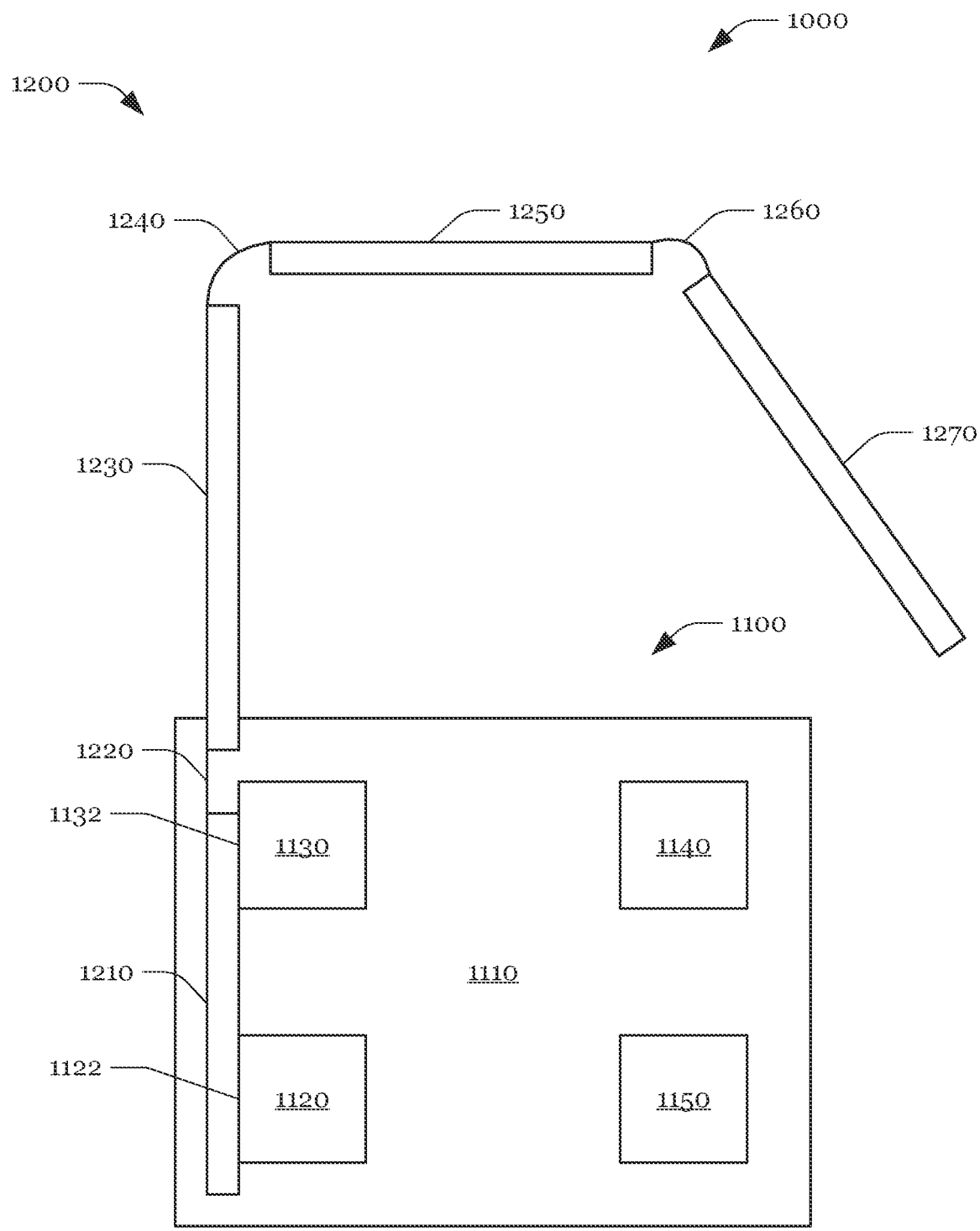
FIG. 3 shows a top view of a system for the assembly of circuit boards, which comprises the assembly device shown in FIGS. 1 and 2 and a rigid-flexible circuit board.

FIG. 3 shows a top view of a system 1000 comprising the assembly device 1100 and a rigid-flexible circuit board 1200. The rigid-flexible circuit board 1200 has a first rigid portion 1210, a second rigid portion 1230, a third rigid portion 1250 and a fourth rigid portion 1270, the first rigid portion 1210 being connected to the second rigid portion 1230 by means of a first flexible member 1220, the second rigid portion 1230 being connected to the third rigid portion 1250 by means of a second flexible member 1240, and the third rigid portion 1250 being connected to the fourth rigid portion 1270 by means of a third flexible member 1260.

In this case, the flexible members 1220, 1240 and 1260 are provided with conductor paths which connect electrical and/or electronic components, which are disposed on the rigid portions 1210, 1230, 1250 and 1270, with one another. For example, the flexible members 1220, 1240 and 1260 may be formed by portions of one or several flexible layers extending between and/or through the rigid portions 1210, 1230, 1250 and 1270. For example, the rigid portions 1210, 1230, 1250 and 1270 may include a plurality of different layers which in their entirety provide the rigid portions 1210, 1230, 1250 and 1270 with rigidity, whereas the flexible members 1220, 1240 and 1260 is formed only of some of the plurality of different layers and are thus flexible.

Figure 4:
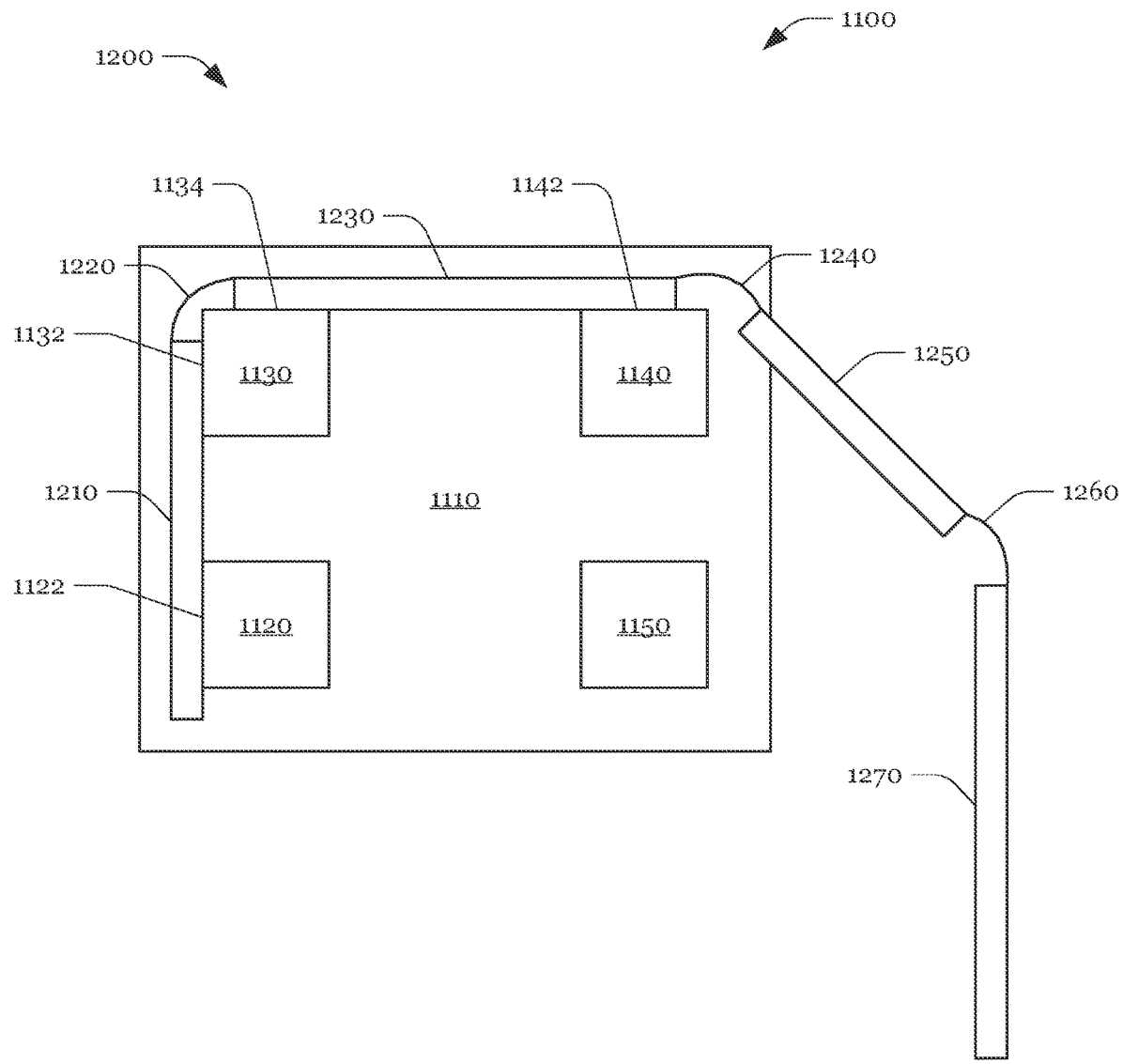
FIGS. 4, 5 and 6 illustrate the laying of rigid portions of the rigid-flexible circuit board shown in FIG. 3 against surfaces of guide portions of the assembly device.
Figure 5:
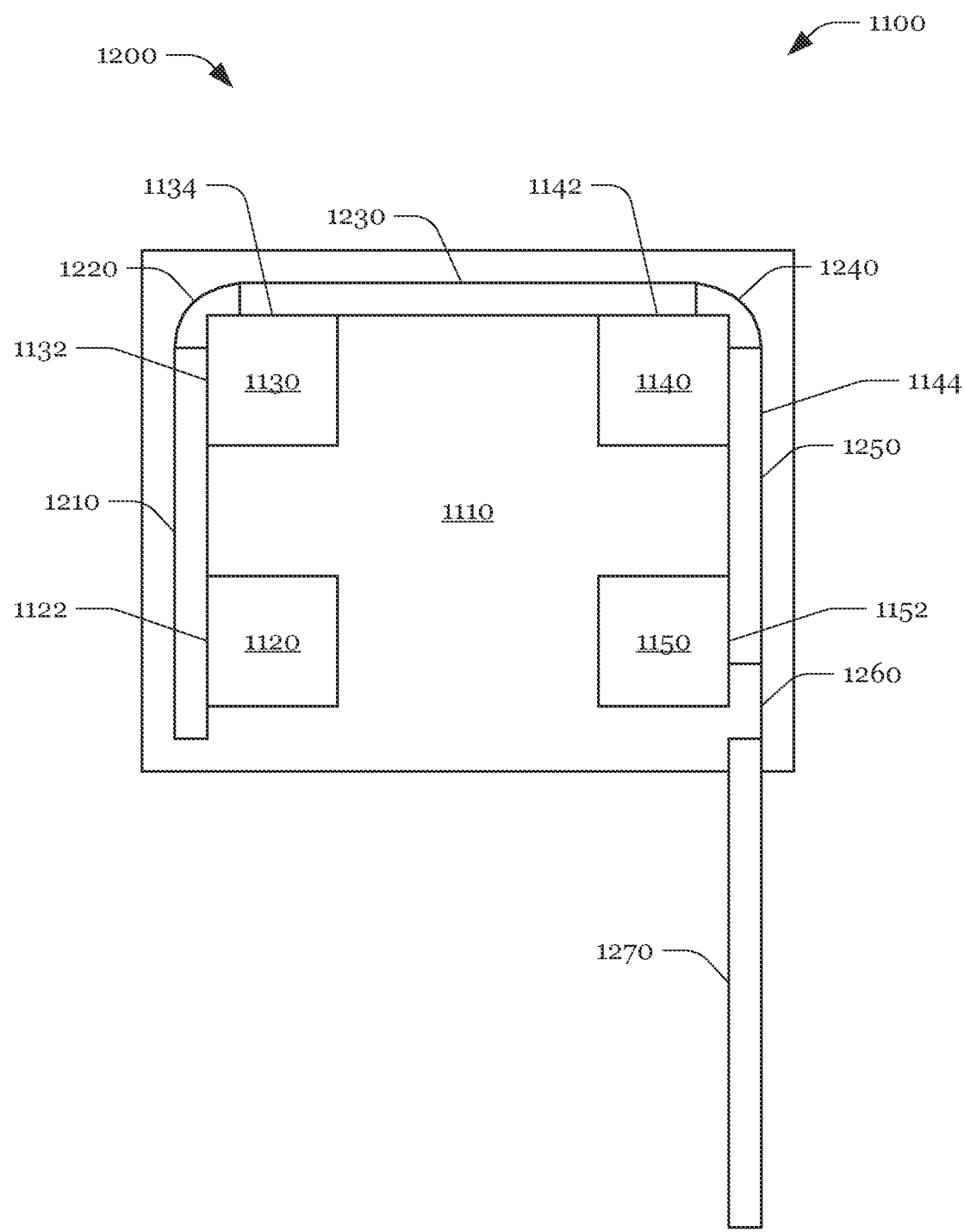

As shown in FIG. 3, the assembly process starts with the first rigid portion 1210 being aligned with the surfaces 1122 and 1132 of the guide members 1120 and 1130. In a second step, as is illustrated by FIG. 4, the second rigid portion 1230 is aligned with the surfaces 1134 and 1142 of the guide members 1130 and 1140, while the first rigid portion 1210 remains or is retained in its position. By aligning the first rigid portion 1210 and the second rigid portion 1230 with the guide members 1120, 1130 and 1140, the flexible member 1220 is bent, so that the flexible member 1220 follows a 90° bend (in a top view). In a third step, as is illustrated by FIG. 5, the third rigid portion 1250 is aligned with the surfaces 1144 and 1152 of the guide members 1140 and 1150, while the first rigid portion 1210 and the second rigid portion 1230 remain or are retained in their positions. By aligning the second rigid portion 1230 and the third rigid portion 1250 with the guide members 1130, 1140 and 1150, the flexible member 1240 is bent, so that the flexible member 1240 also follows a 90° bend (in a top view).

Figure 6:
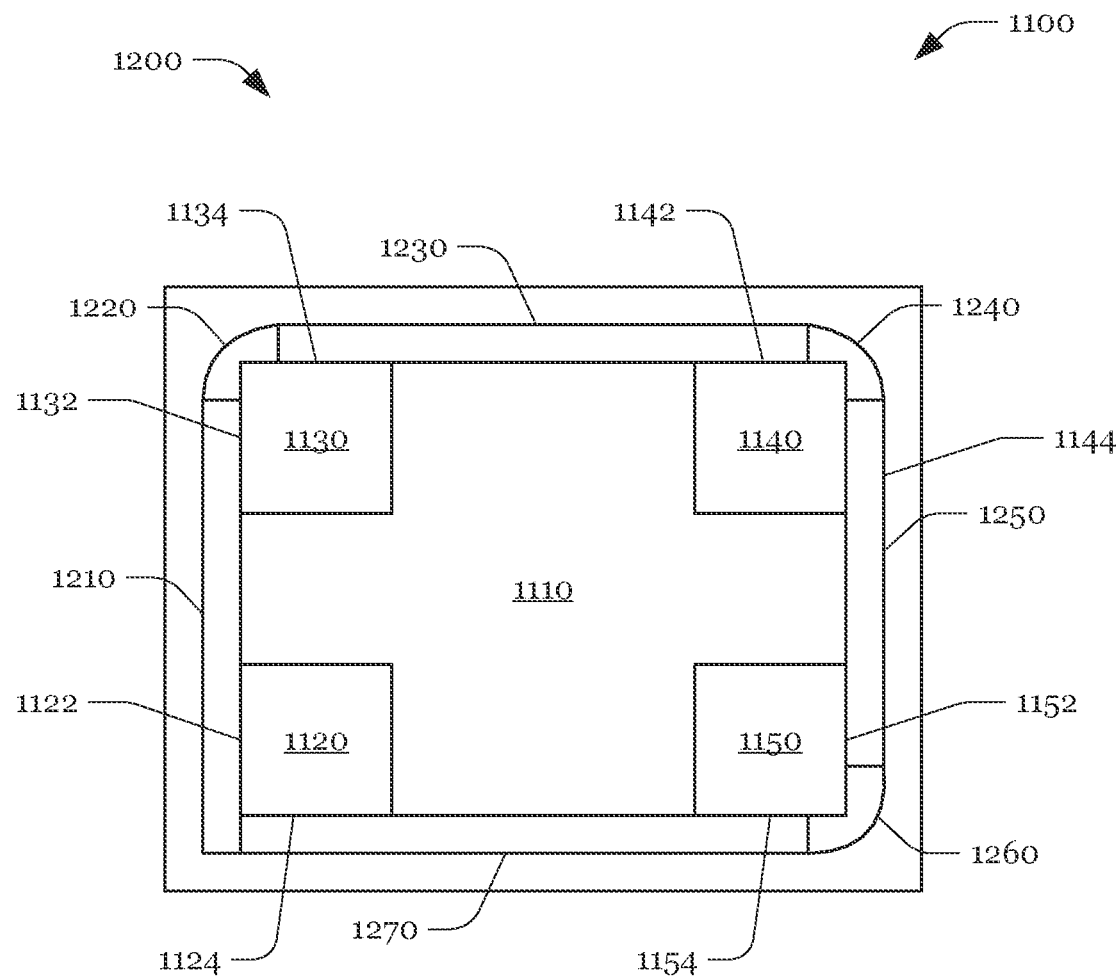

In a fourth step, as is illustrated by FIG. 6, the fourth rigid portion 1270 is aligned with the surfaces 1154 and 1124 of the guide members 1150 and 1120, while the first rigid portion 1210, the second rigid portion 1230 and the third rigid portion 1250 remain or are retained in their positions. By aligning the third rigid portion 1250 and the fourth rigid portion 1270 with the guide members 1140, 1150 and 1120, the flexible member 1260 is bent, so that the flexible member 1260 also follows a 90° bend (in a top view). At the end of the fourth step, the circuit board 1200 is thus arranged such that the first rigid portion 1210 and the third rigid portion 1250 are oriented parallel to each other, the second rigid portion 1230 and the fourth rigid portion 1270 are oriented parallel to each other, and the flexible members 1220, 1240 and 1260 each follow a 90° bend. In a fifth step, the fourth rigid portion 1270 is then attached to the first rigid portion 1210. For example, the fourth rigid portion 1270 may be attached to the first rigid portion 1210 by means of a screw.

Figure 7:
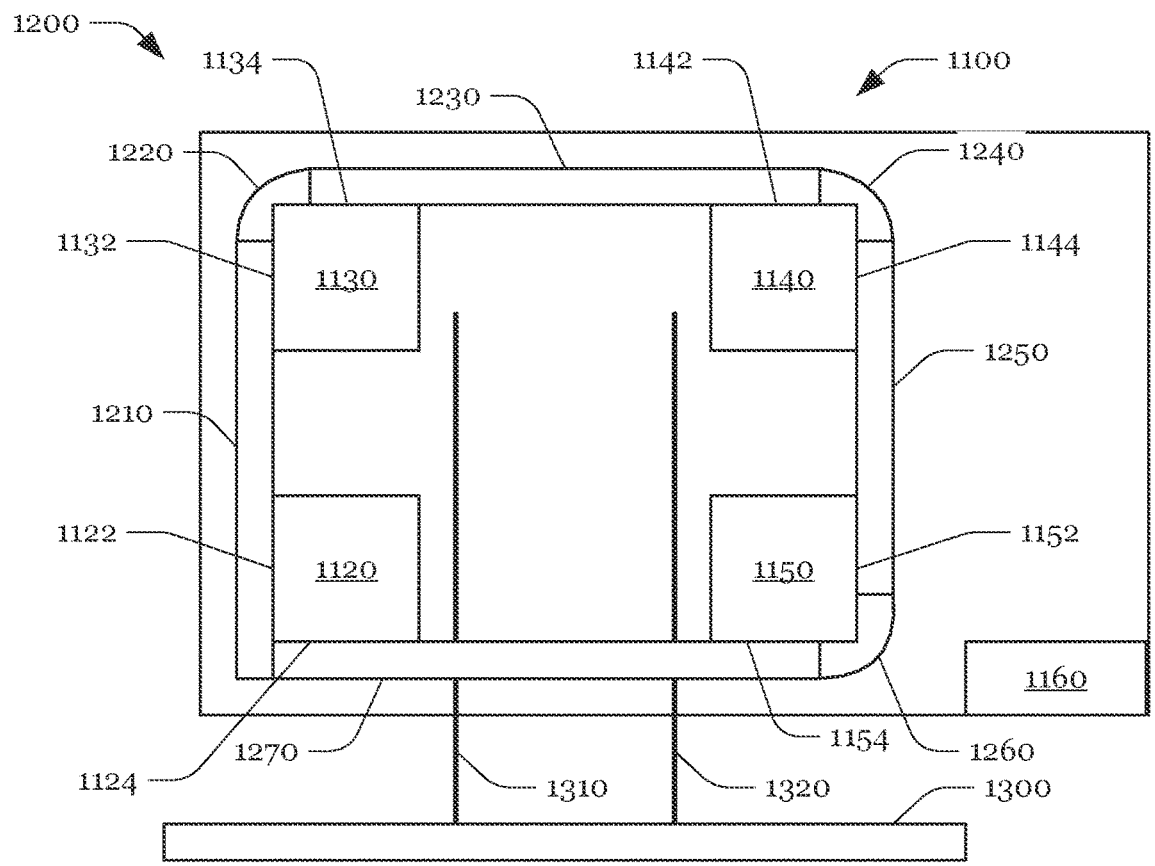
FIGS. 7 and 8 illustrate the insertion of a bottom plate into the rigid-flexible circuit board shown in FIGS. 4, 5 and 6.
Figure 8:
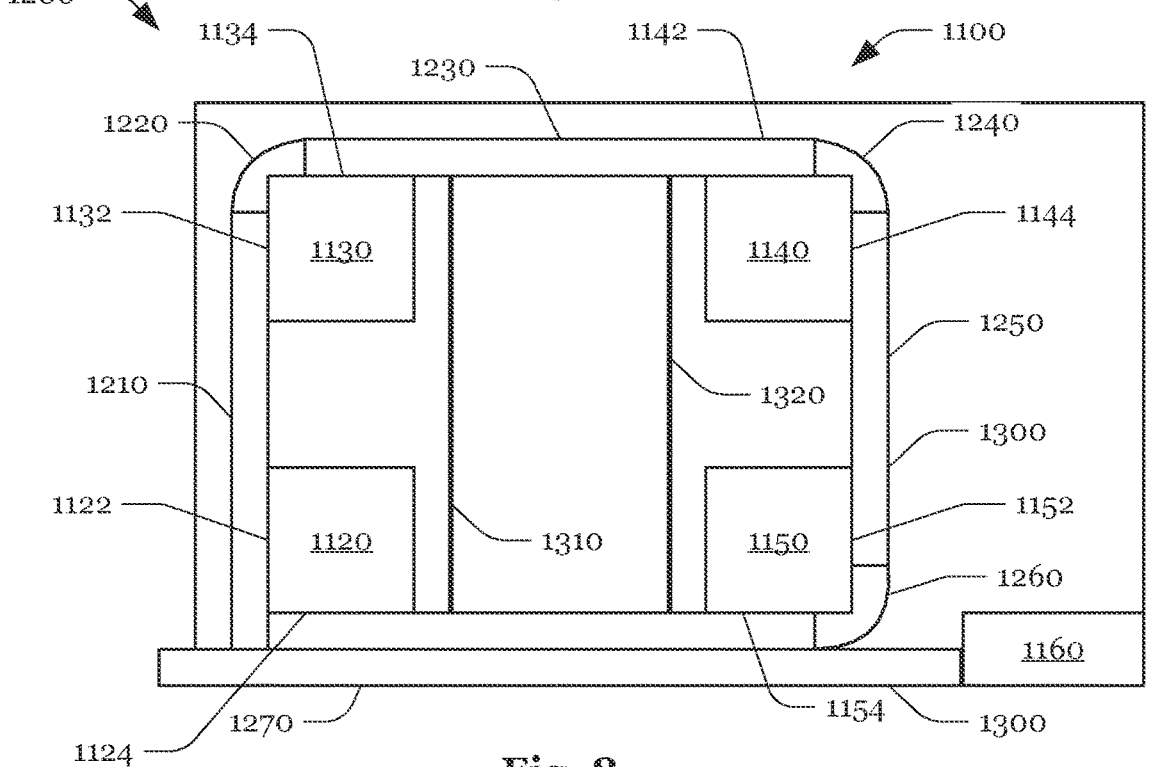

As is illustrated by FIGS. 7 and 8, a bottom plate 1300 is then connected in a sixth step with the circuit board 1200 by the bottom plate 1300, which includes two elongate members 1310 and 1320, being inserted into the rigid portion 1270. In the process, the elongate members 1310 and 1320 are guided through openings in the rigid portions 1270 and 1230, so that the bottom plate 1300, which is fully inserted into the circuit board 1200, stabilizes or fixes the rigid portions 1210, 1230, 1250 and 1270 of the circuit board 1200 with regard to their position and orientation. As required, the bottom plate 1300 may further be provided with more than the two elongate members 1310 and 1320 shown (e.g. with four elongate members 1310 and 1320). Moreover, the bottom plate 1300 may engage with the circuit board 1200 when the bottom plate 1300 is fully inserted into the circuit board 1200. For example, the bottom plate 1300 may have a projection and the circuit board 1200 may be pushed behind the projection during insertion, so that the projection impedes a pulling-out of the bottom plate 1300.

Figure 9:
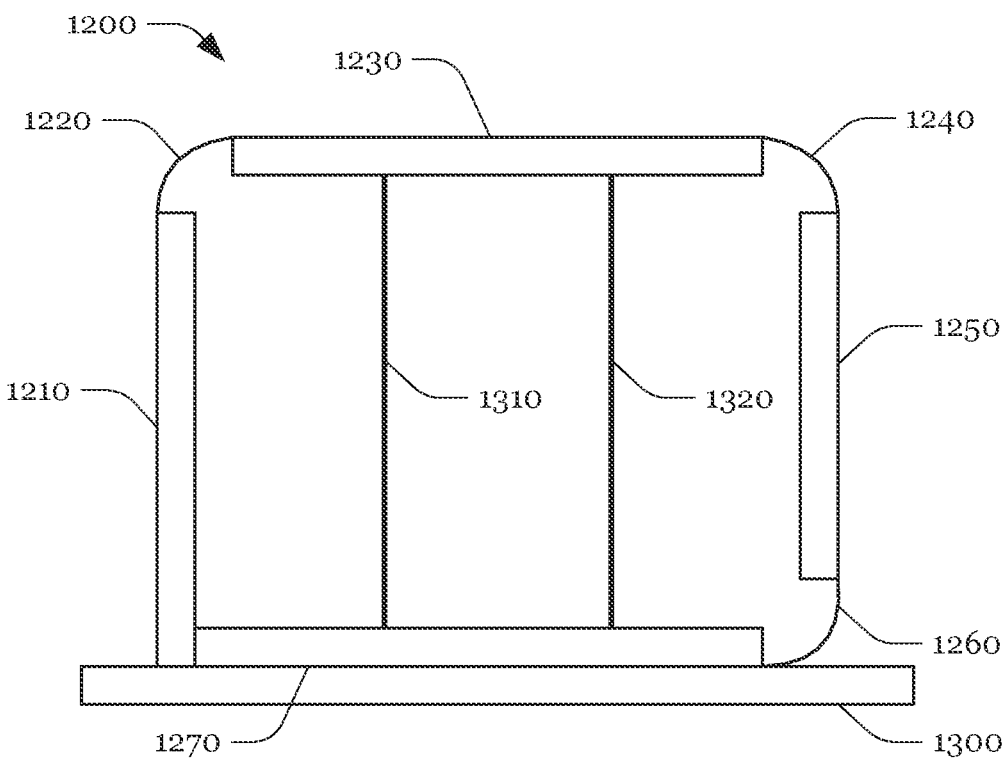
FIG. 9 shows the rigid-flexible circuit board shown in FIG. 8 after it has been pulled off the assembly device.
Figure 10:
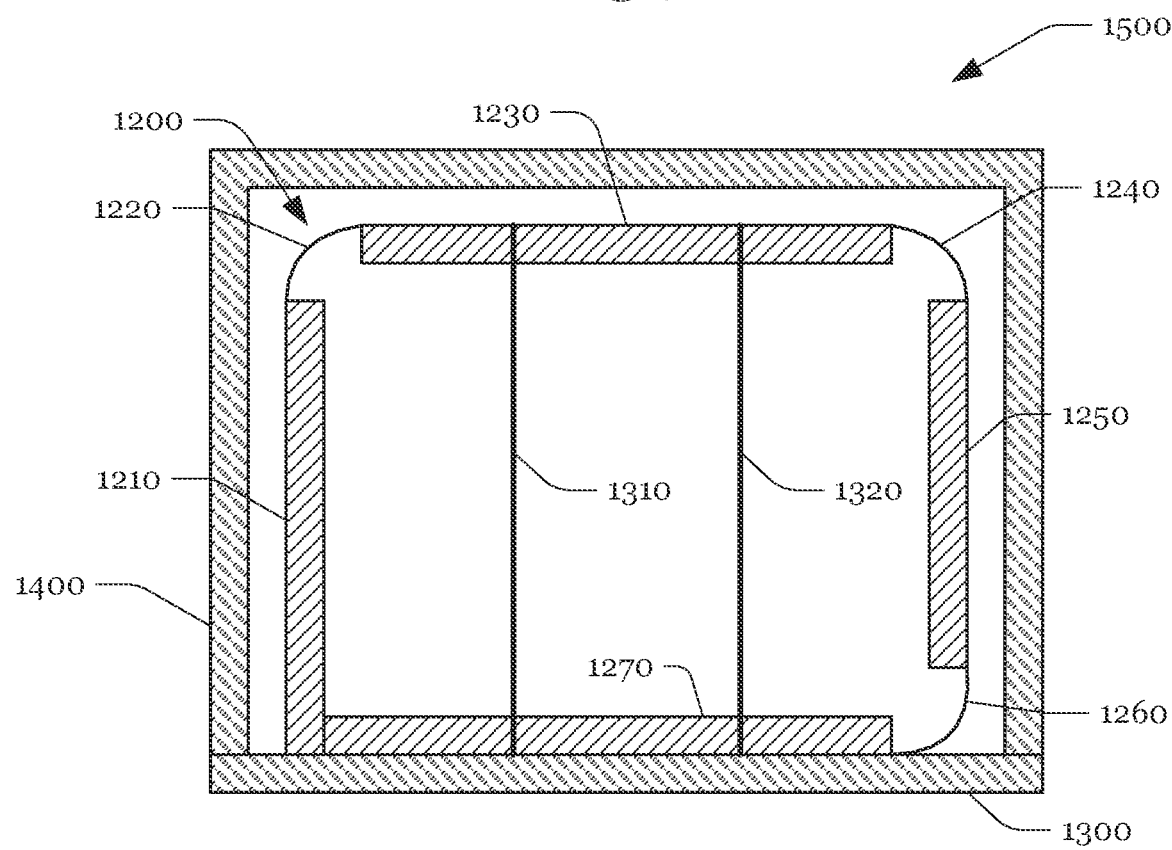
FIG. 10 shows a section through a housing, which is formed by the bottom plate and a top housing part connected to the bottom plate and which encloses the circuit board.

As is illustrated by FIG. 9, the circuit board 1200 is pulled off from the assembly device 1100 in a seventh step after the insertion of the bottom plate 1300. After the circuit board 1200 has been pulled off, the top housing part 1400 is attached to the bottom plate 1300, whereby the circuit board 1200 is disposed in a closed housing, as is illustrated by FIG. 10. For example, the top housing part 1400 may have a projection and the bottom plate 1300 may be pushed behind the projection during insertion, so that the projection impedes the top housing part 1400 being pulled off. Alternatively, or additionally, the top housing part 1400 may be screwed to the bottom plate 1300. The housing and the circuit board 1200 disposed in the housing form an (electrical or electronic) apparatus 1500, such as an electronic control device, for example, which has terminals that are accessible through openings in the housing.

Figure 11:
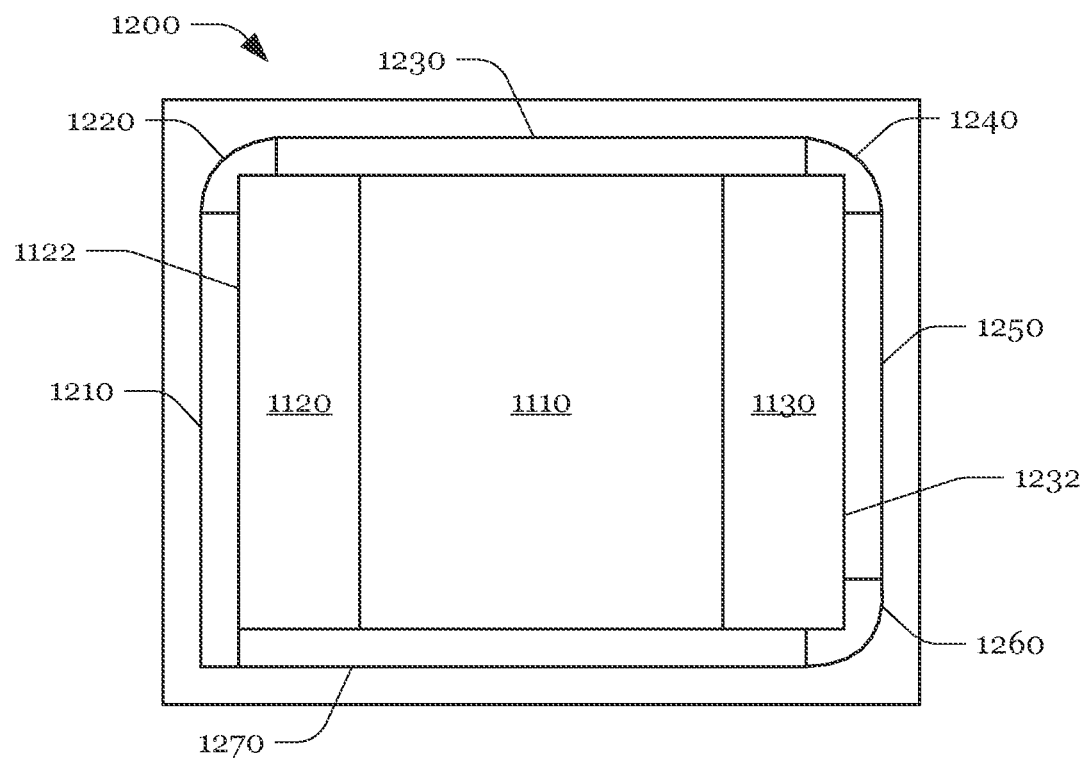
FIG. 11 illustrates a possible modification of the assembly device shown in FIGS. 1 to 10.

As is illustrated in FIG. 11, the assembly device 1100 shown in FIGS. 1 to 10 can be modified in such a way that, instead of the four guide members 1120, 1130, 1140 and 1150, only two guide members 1120 and 1130 are provided that extend into the space enclosed in the horizontal direction by the circuit board 1200.

Figure 12:
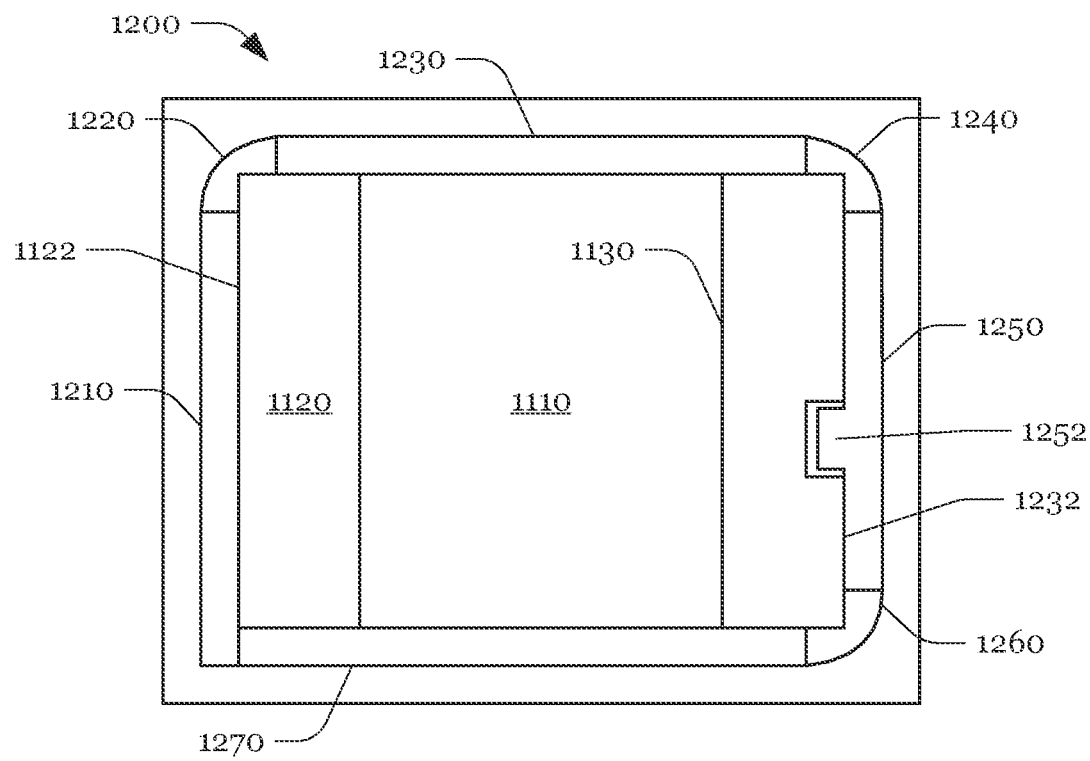
FIG. 12 illustrates a possible modification of the assembly device shown in FIG. 11.

As illustrated in FIG. 12, the guide member 1130 (and, of course, also the guide member 1120) of the assembly device 1100 shown in FIG. 11 may be provided with a recess into which an electrical or electronic component 1252 arranged on the rigid portion 1250 is introduced when the third rigid portion 1250 is aligned with the surface of the guide member 1130. In this case, the recess may be dimensioned such that the electrical or electronic component 1252 does not touch the guide member 1130 or just about comes into contact with the guide member 1130 when other regions of the rigid portion 1250 also come into contact with the guide member 1130.

Figure 13:
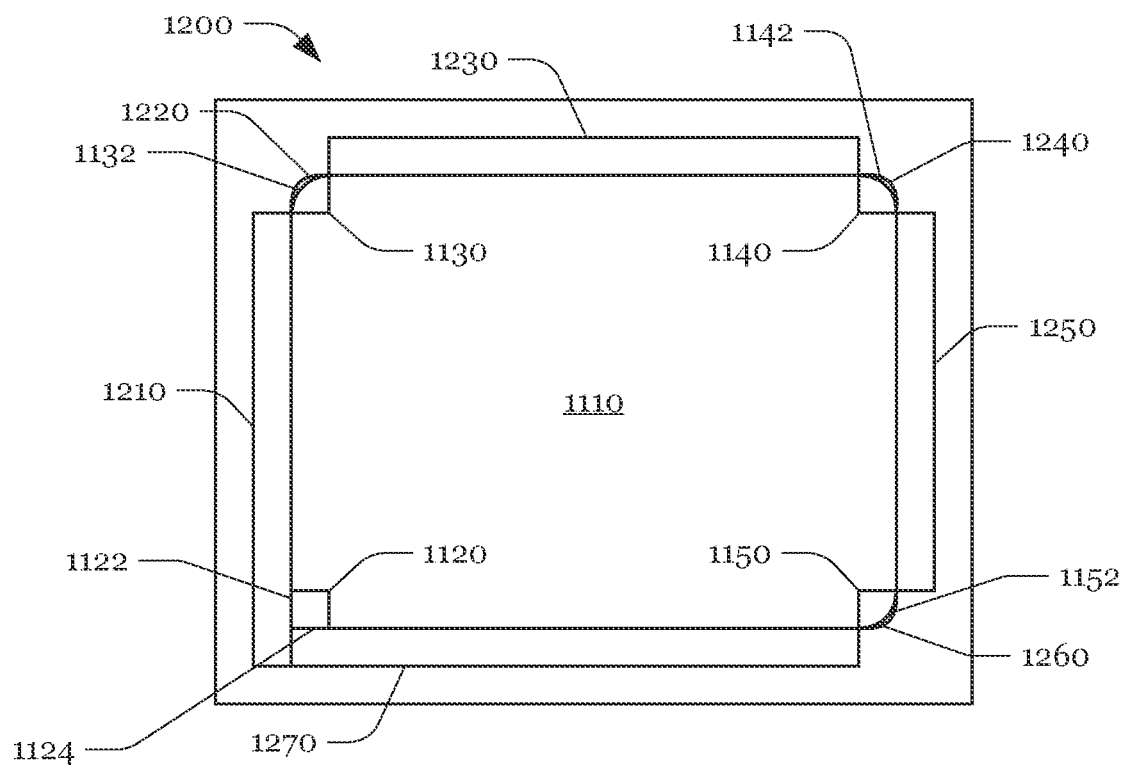
FIG. 13 illustrates a possible modification of the circuit board shown in FIGS. 3 to 12 and of the assembly process.
Figure 14:
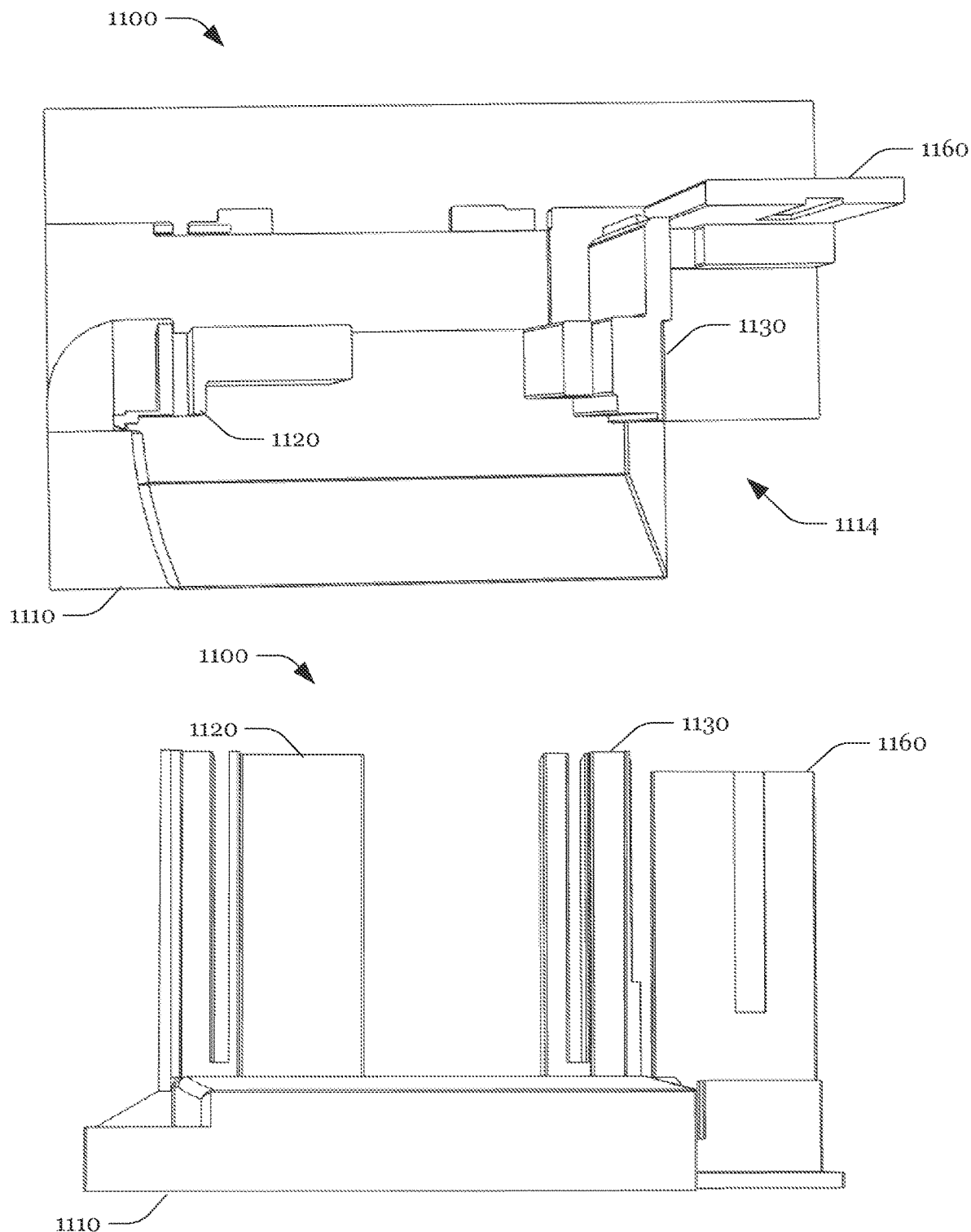
FIGS. 14, 15, 16 and 17 show perspective views from above and from one side onto an assembly device.
Figure 15:
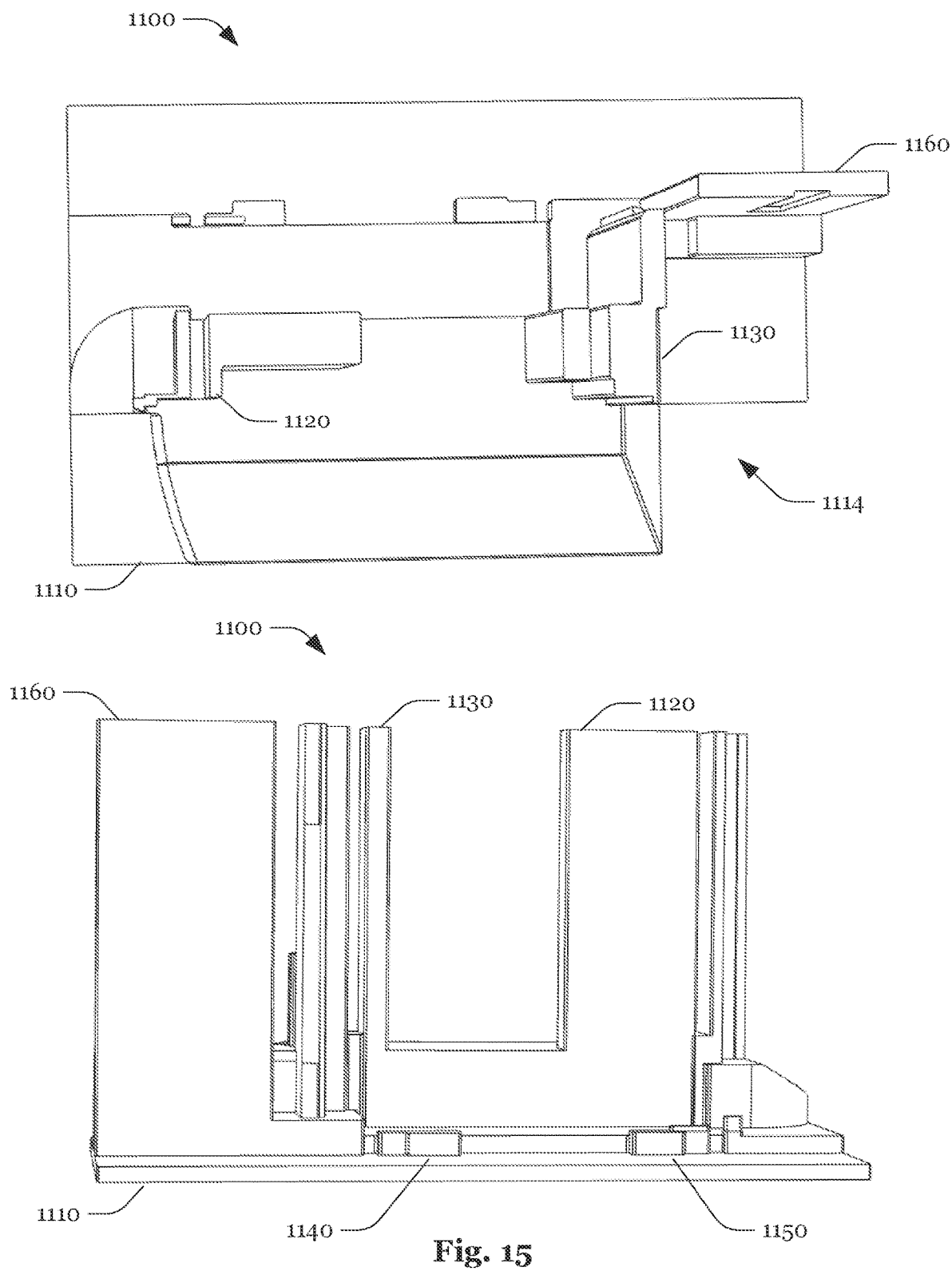
Figure 16:
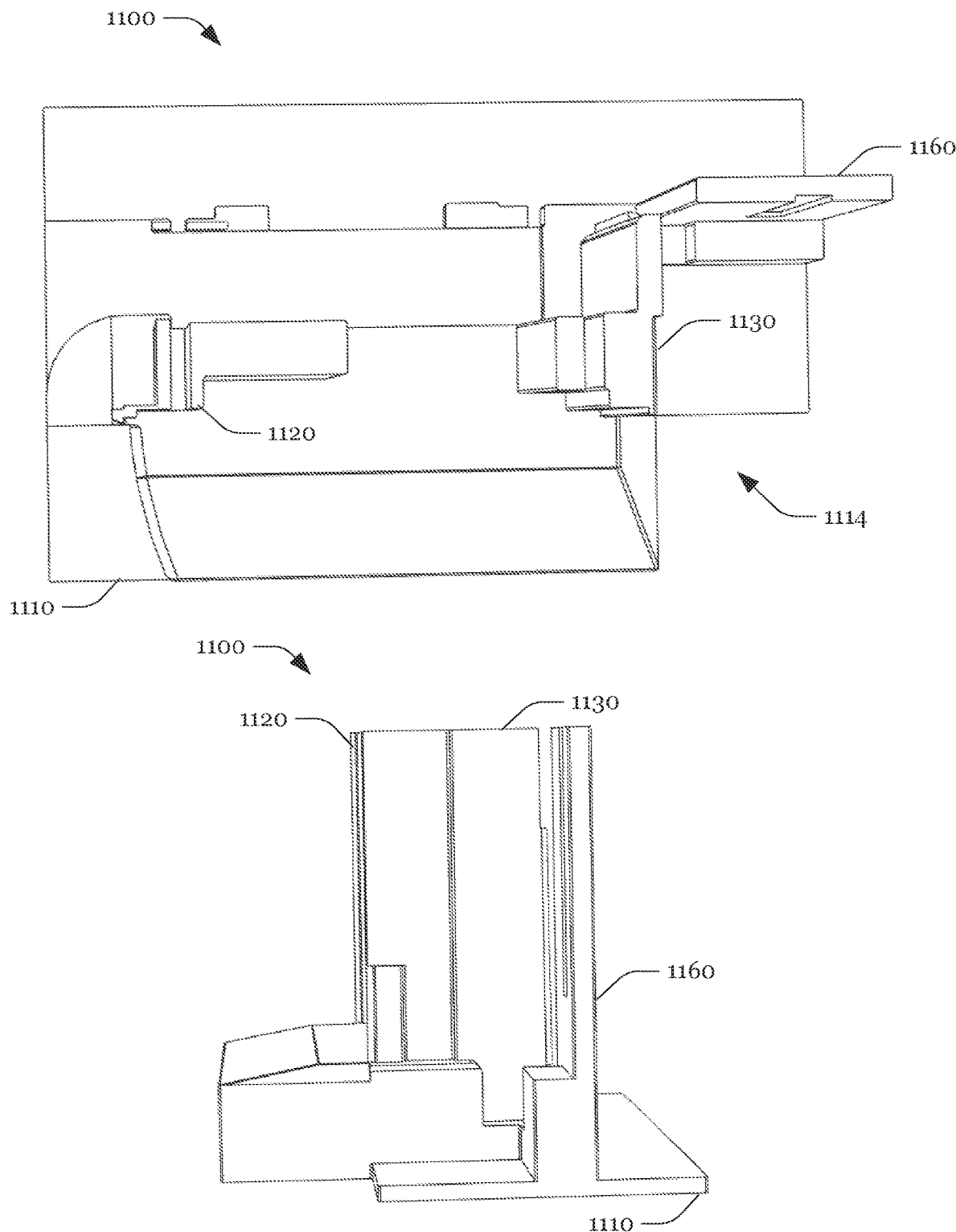
Figure 17:
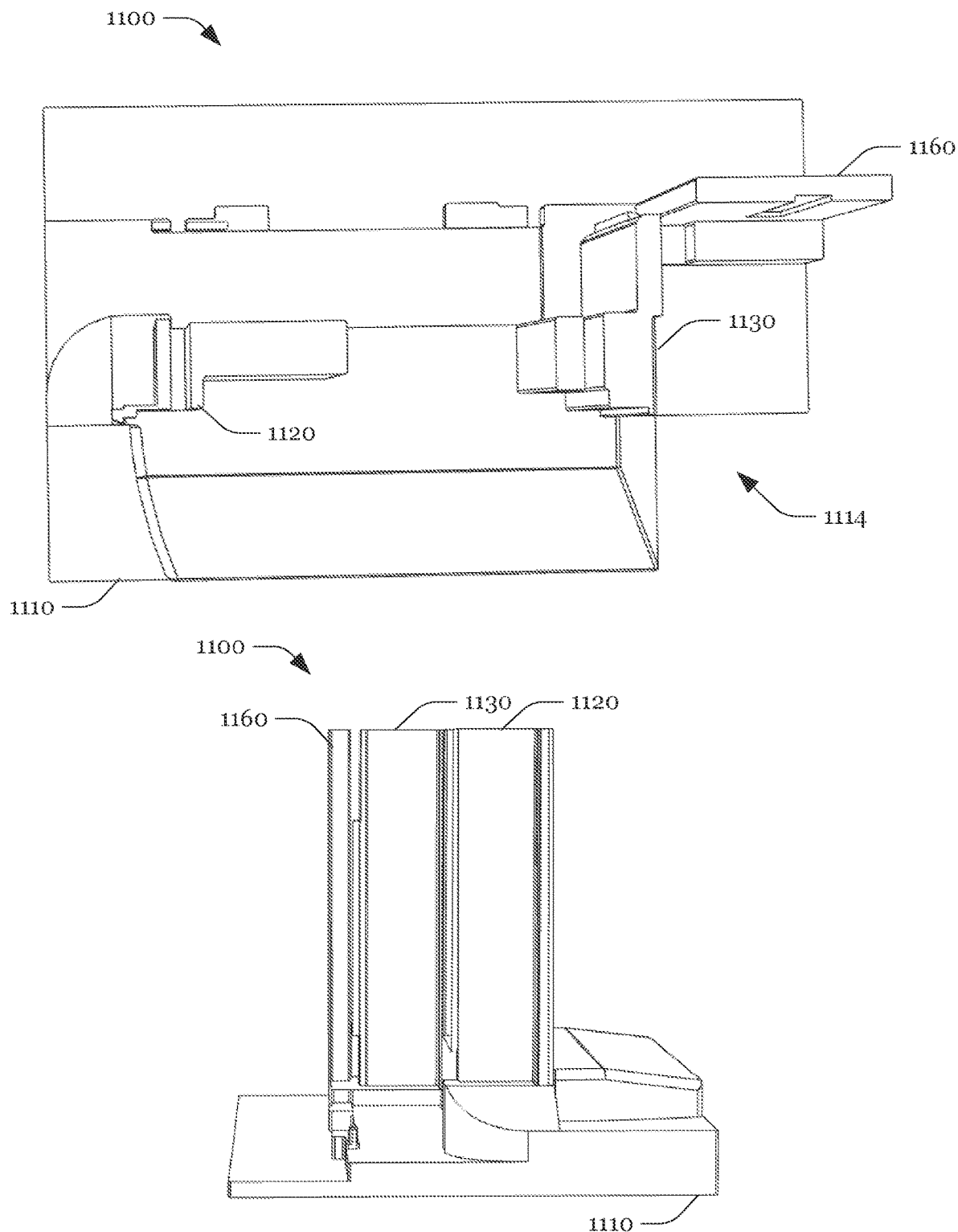

FIG. 13 illustrates a possible modification of the circuit board shown in FIGS. 3 to 12 and of the assembly process, in which the flexible members 1220, 1240, 1260 abut against the surfaces 1132, 1142 and 1152. In this case, it is understood that in other embodiments, one or several of the rigid portions 1210, 1230, 1250 and 1250 as well as one or several of the flexible members 1220, 1240, 1260 may abut against guide portions of one or several of the guide members 1120, 1130, 1140 and 1150, as is illustrated by means of the assembly device 1100 described below.

Figure 18:
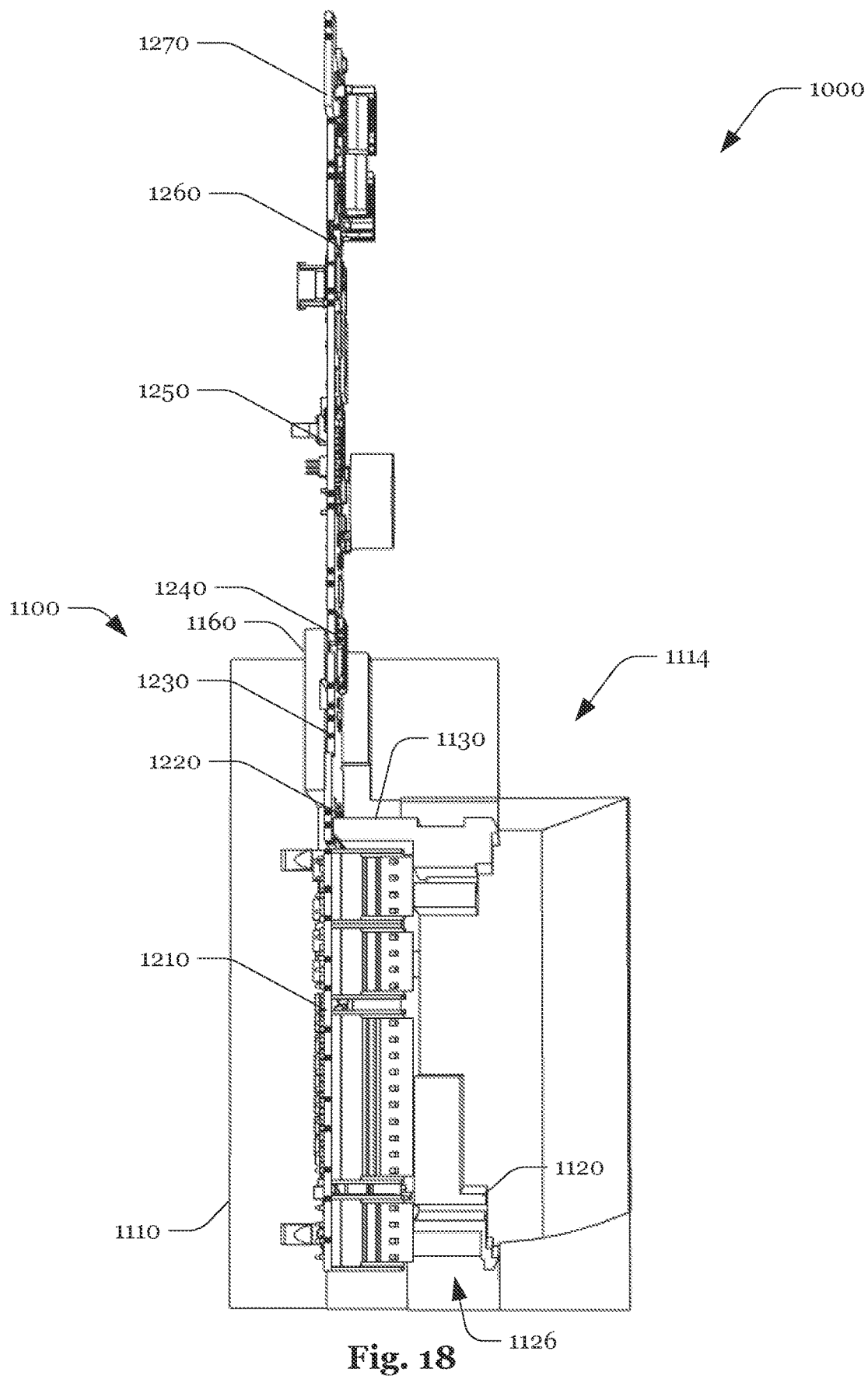
FIGS. 18, 19, 20 and 21 illustrate an assembly process using the assembly device shown in FIGS. 14, 15, 16 and 17 and a circuit board.
Figure 19:
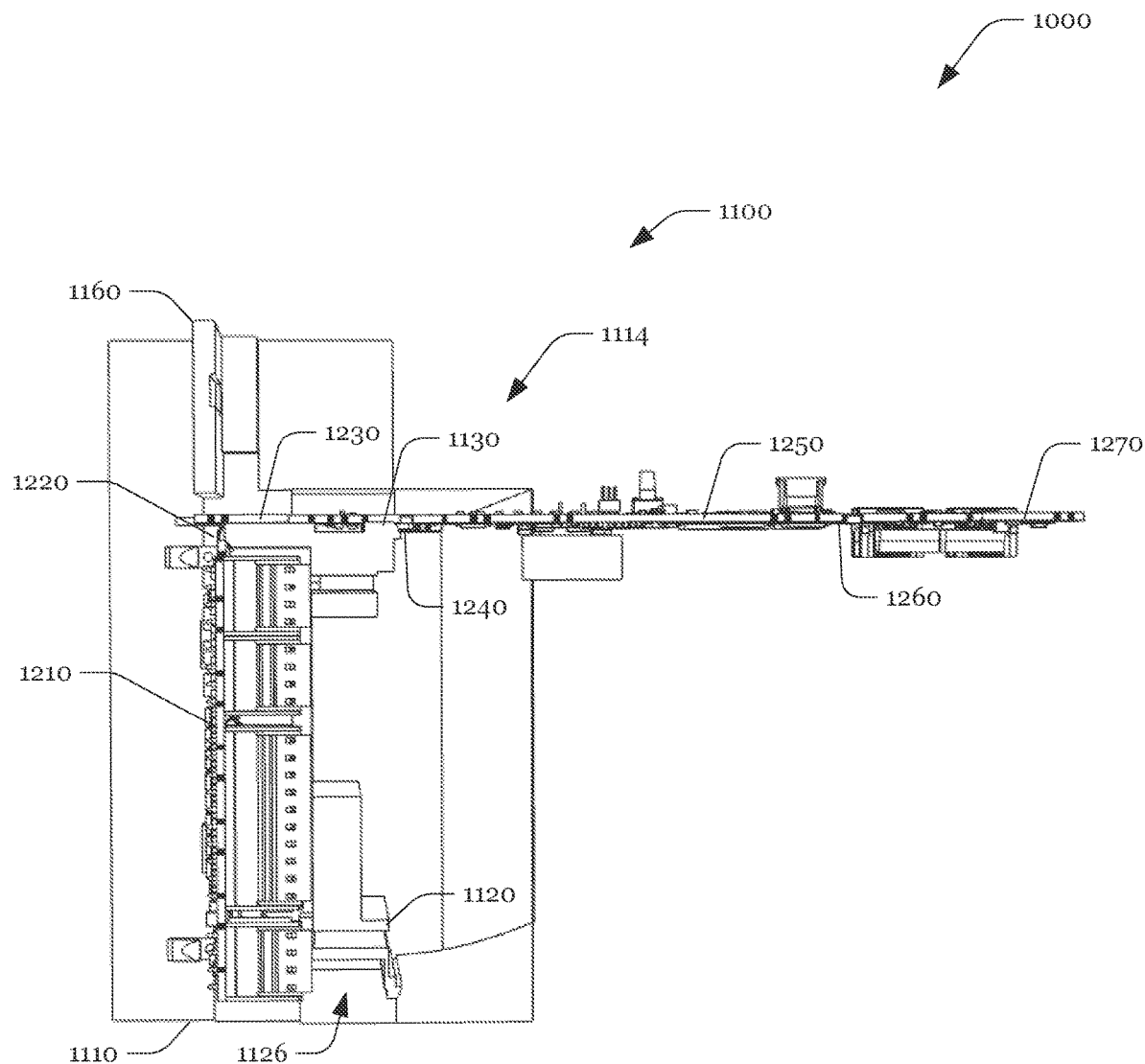

In this respect, FIGS. 14, 15, 16 and 17 show perspective views of another exemplary assembly device 1100 with a rectangular base plate 1110 in the form of a quadrangle, which has a quadrangular cut-out 1114 at one corner, two guide members 1120 and 1130 extending over the full height of the assembly device 1100, and another member 1160, which also extends over the full height of the assembly device 1100 and against which, as shown in FIG. 18, the second rigid portion 1230 abuts when the first rigid portion 1210 abuts against the guide member 1120. Moreover, the assembly device 1100 comprises further guide members (e.g. the guide members 1140 and 1150 shown in FIG. 15), which do not extend over the full height of the assembly device 1100.

Figure 20:
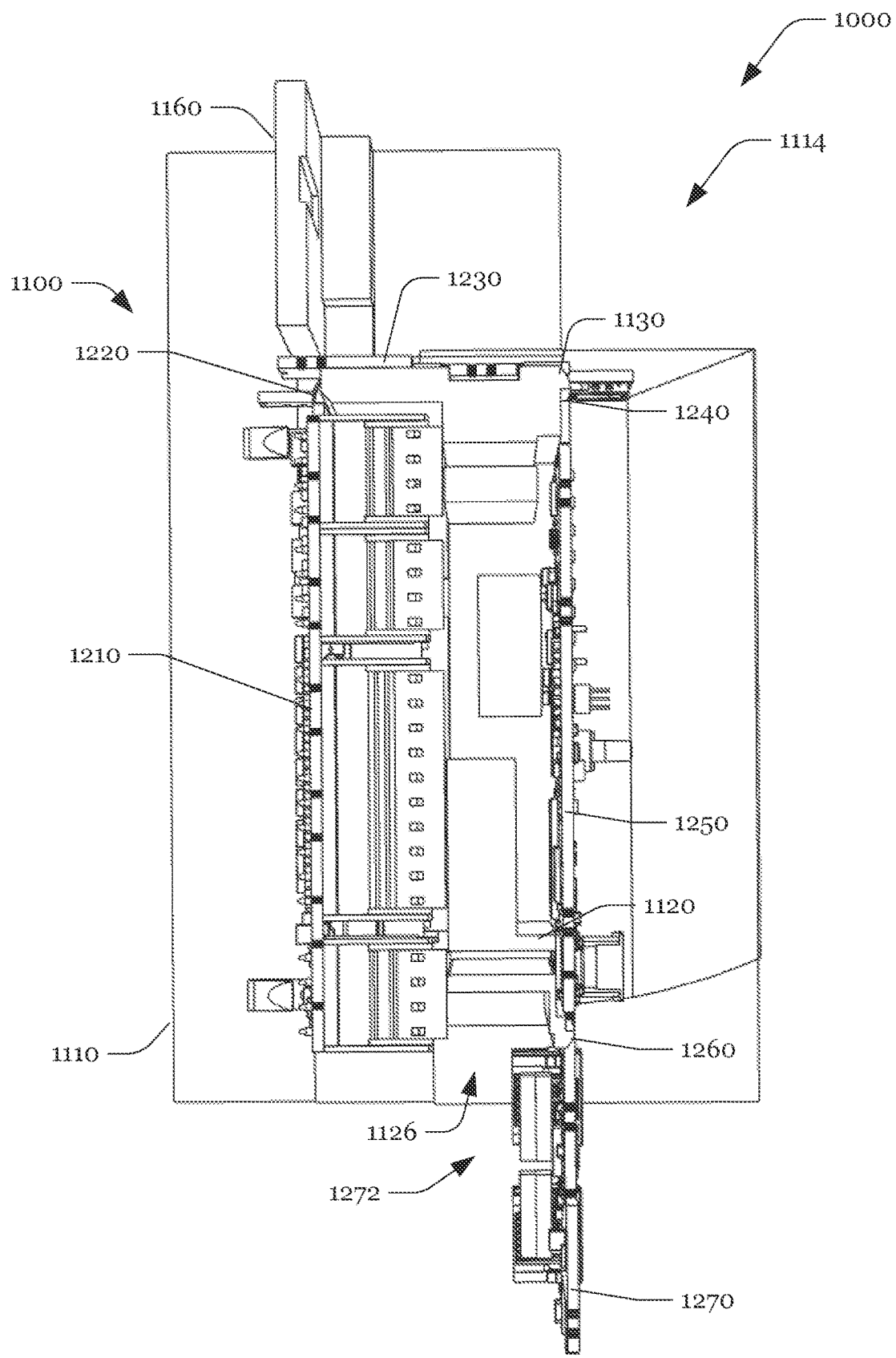
Figure 21:
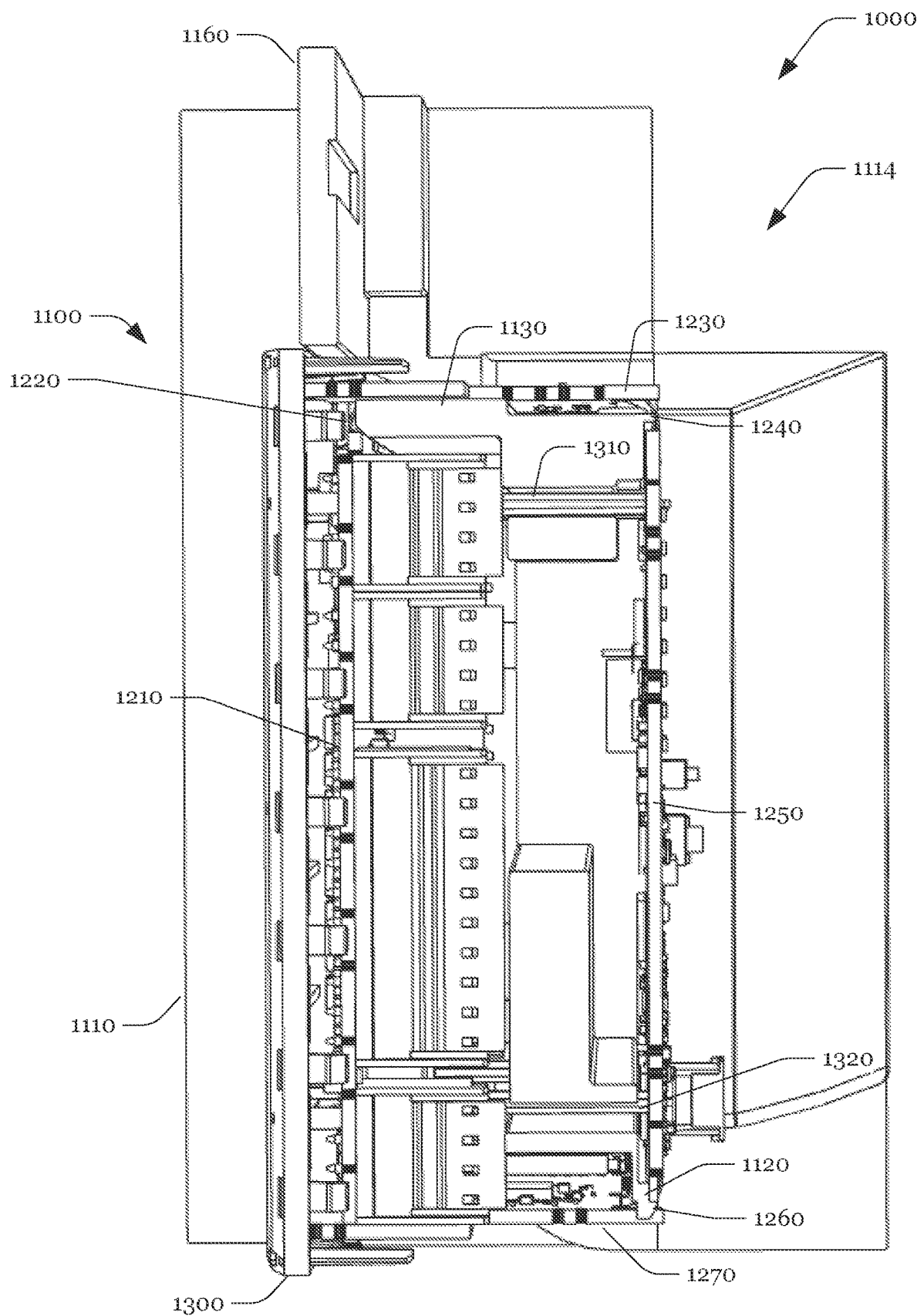

As is illustrated in FIGS. 18, 19, 20 and 21, the guide members 1120 and 1130 are configured such that the electrical or electronic components disposed on the circuit board 1200 are not subjected to excessive loads during assembly. Thus, the guide members 1120 and 1130 are provided with recesses into which the electrical or electronic components arranged on the circuit board 1200 are introduced when the rigid portions 1210, 1230, 1250 and 1270 abut against the guide members 1120 and 1130. For example, the guide member 1120 has a recess 1126 into which, as illustrated by FIGS. 20 and 21, a component 1272 arranged on the rigid portion 1270 is introduced when the rigid portion 1270 is laid against the guide member 1120. Moreover, the member 1160, together with the base plate 1110, frames the bottom plate 1300 on two sides, as is shown in FIG. 21, when the bottom plate 1300 is fully inserted into the circuit board 1200.

Figure 22:
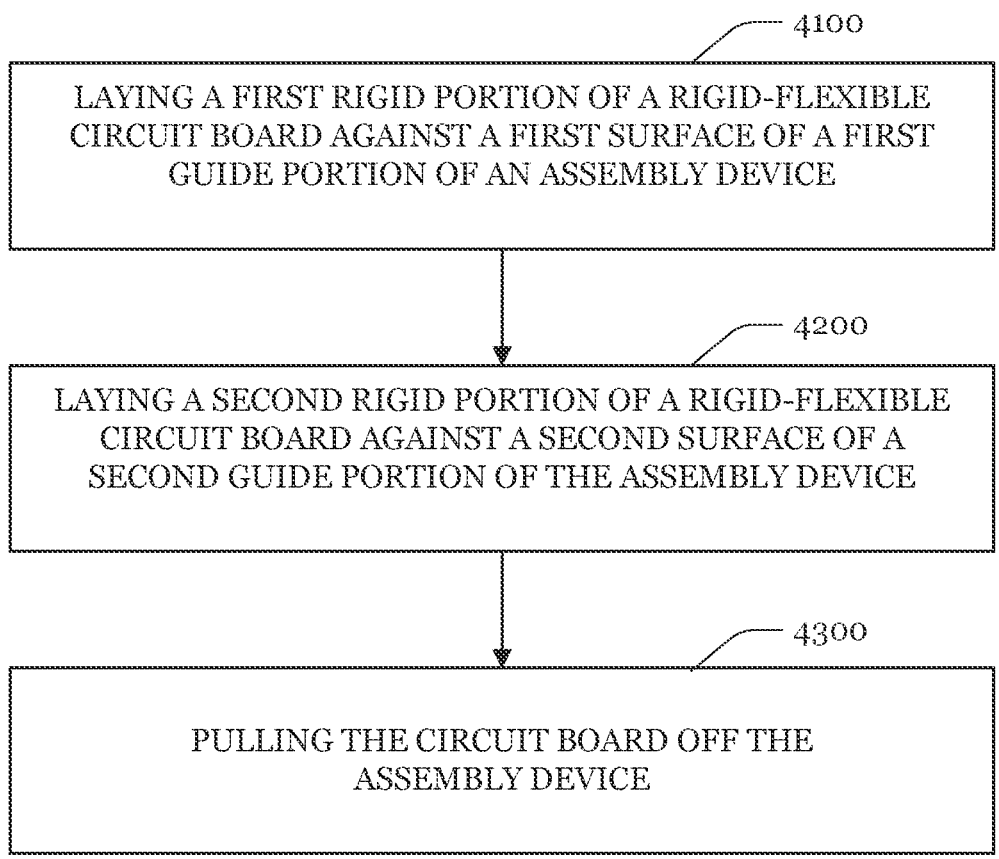
FIG. 22 shows a flowchart of the assembly process.

FIG. 22 shows a flowchart of the assembly process. The process starts with step 4100, in which the first rigid portion 1210 of the rigid-flexible circuit board 1200 is laid against the surface 1122 of a first guide portion of the assembly device 1100. This is followed by step 4200, in which the second rigid portion 1230 of the rigid-flexible circuit board 1200 is laid against the surface 1132 of a second guide portion of the assembly device 1100. The process ends with step 4300, in which the circuit board 1200 is pulled off from the assembly device 1100. As described above, the process can be supplements with further steps, such as inserting the bottom plate 1300 and fitting the top housing part 1400 onto the bottom plate 1300.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A system for an assembly of circuit boards, the system comprising:
    an assembly device having a substantially planar base plate and guide members that extend from the base plate in a vertical direction if the base plate is placed on a horizontal surface;
    a circuit board having rigid portions including a first rigid portion, a second rigid portion, a third rigid portion, and a fourth rigid portion that are connected together by flexible members, the flexible members including a first flexible member, a second flexible member and a third flexible member, the first rigid portion being connected to the second rigid portion via the first flexible member, the second rigid portion being connected to the third rigid portion via the second flexible member, and the third rigid portion being connected to the fourth rigid portion via the third flexible member; and
    a bottom plate configured for positive connection to the circuit board, wherein the guide members are configured to extend into a space partially or completely enclosed, in a horizontal direction, by the circuit board, and wherein the guide members determine a position and orientation of the rigid portions of the circuit board relative to the base plate since the guide members have surfaces against which one or several of the rigid portions and/or one or several of the flexible members abut during the assembly, wherein, when the base plate is placed on the horizontal surface and the circuit, the guide members are connected to the circuit board positively in the horizontal direction and frictionally in the vertical direction so that the circuit board is slidable with respect to the guide members in the vertical direction, such that the circuit board is adapted to be pulled off the assembly device in an upward direction, and wherein the bottom plate has an elongate member that extends substantially parallel to the base plate, the elongate member extending through a first opening in one of the rigid portions and through a second opening in another of the rigid portions when the bottom plate is positively connected to the circuit board, and wherein the guide members are configured not to impede a vertical movement of the elongate member when the circuit board is pulled off the assembly device in the upward direction.

2. The system according to claim 1, wherein the assembly device has another member extending from the base plate in the vertical direction, which, together with the base plate, frames the bottom plate, which is substantially quadrangular, on two sides when the bottom plate is fully inserted into the circuit board.

3. The system according to claim 2, wherein the first rigid portion is arranged substantially parallel and directly adjacent to the bottom plate when the bottom plate is fully inserted into the circuit board.

4. The system according to claim 1, wherein the bottom plate is engaged with the circuit board when the bottom plate is fully inserted into the circuit board.

5. The system according to claim 1, wherein the fourth rigid portion is attached to the first rigid portion via a detachable connection.

6. The system according to claim 1, wherein the first rigid portion and the third rigid portion are shorter or longer than the second rigid portion and the fourth rigid portion.

7. The system according to claim 1, wherein the base plate has a recess into which one of the rigid portions reaches when the rigid portion is correctly arranged on the base plate.

8. The system according to claim 1, further comprising a rack, wherein the base plate is connected rotatably about a vertical axis to the rack.

9. An apparatus comprising:
a rigid-flexible circuit board with a first rigid portion, a second rigid portion, a third rigid portion, and a fourth rigid portion;
a bottom plate with a first elongate member and a second elongate member, which extend substantially perpendicularly to the bottom plate; and
a top housing part which is enclosed on all sides except for a bottom side that forms an opening through which the rigid-flexible circuit board is inserted into the top housing part, wherein the first rigid portion is arranged substantially parallel to the third rigid portion, and the second rigid portion is arranged substantially parallel to the fourth rigid portion, wherein the first elongate member extends through a first opening in the first rigid portion and connects the third rigid portion with the first rigid portion so as to fix the bottom plate to the rigid-flexible circuit board, wherein the second elongate member extends through a second opening in the first rigid portion and connects the third rigid portion with the first rigid portion so as to fix the bottom plate to the rigid-flexible circuit board, and wherein the bottom plate forms a cover that closes the opening of the top housing part when the rigid-flexible circuit board, that is fixed to the bottom plate, is inserted into the top housing part.

10. The apparatus according to claim 9, wherein the first elongate member extends through a first opening in the third rigid portion, and wherein the second elongate member extends through a second opening in the third rigid portion.

11. The apparatus according to claim 9, wherein the bottom plate further has a third elongate member and/or a fourth elongate member, which extend substantially perpendicularly to the bottom plate, wherein the third elongate member extends through a third opening in the first rigid portion and connects the third rigid portion with the first rigid portion, and wherein the fourth elongate member extends through a fourth opening in the first rigid portion and connects the third rigid portion with the first rigid portion.

12. The apparatus according to claim 11, wherein the third elongate member extends through a third opening in the third rigid portion, and wherein the fourth elongate member extends through a fourth opening in the third rigid portion.

13. The apparatus according to claim 9, wherein the first rigid portion is connected to the second rigid portion via a first flexible member, the second rigid portion is connected to the third rigid portion via a second flexible member, and the third rigid portion is connected to the fourth rigid portion via a third flexible member.

14. The apparatus according to claim 9, wherein the first rigid portion is arranged substantially parallel and directly adjacent to the bottom plate.

15. A method for the assembly of rigid-flexible circuit boards, the method comprising:
arranging a first rigid portion of a rigid-flexible circuit board against a first surface of a first guide member of an assembly device;
arranging a second rigid portion of the rigid-flexible circuit board against a second surface of a second guide member of the assembly device by bending a first flexible portion connecting the first rigid portion and the second rigid portion;
arranging a third rigid portion of the rigid-flexible circuit board against a third surface of a third guide member of the assembly device by bending a second flexible portion connecting the second rigid portion and the third rigid portion;
arranging a fourth rigid portion of the rigid-flexible circuit board against a fourth surface of a fourth guide member of the assembly device by bending a third flexible portion connecting the third rigid portion and the fourth rigid portion;
connecting a bottom plate to the circuit board; and
pulling off the circuit board from the assembly device along a direction which is substantially parallel to the first rigid portion, the second rigid portion, the third rigid portion and the fourth rigid portion, wherein the first guide member, the second guide member, the third guide member and the fourth guide member extend from a base plate of the assembly device in a vertical direction when the base plate is placed on a horizontal surface, wherein when the base plate is placed on the horizontal surface, the first guide member, the second guide member, the third guide member and the fourth guide member are connected to the circuit board positively in the horizontal direction and frictionally in the vertical direction so that the circuit board is slidable with respect to the first guide member, the second guide member, the third guide member and the fourth guide member in the vertical direction, to enable the circuit board to be pulled off of the assembly device; and wherein the bottom plate has an elongate member that extends substantially parallel to the base plate, the elongate member extending through a first opening in one of the rigid portions and through a second opening in another of the rigid portions when the bottom plate is connected to the circuit board, and wherein the guide members are configured not to impede a vertical movement of the elongate member when the circuit board is pulled off the assembly device in the upward direction.

16. The method according to claim 15, wherein the first rigid portion is oriented parallel to the third rigid portion and the second rigid portion is oriented parallel to the fourth rigid portion when the rigid portions abut against the guide portions.

17. The method according to claim 15, further comprising:
fitting a top housing part on the bottom plate.

* * * * *